(12) United States Patent
Choi

(10) Patent No.: US 8,022,971 B2
(45) Date of Patent: Sep. 20, 2011

(54) DATA DRIVER, ORGANIC LIGHT EMITTING DISPLAY, AND METHOD OF DRIVING THE SAME

(75) Inventor: Sang Moo Choi, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1137 days.

(21) Appl. No.: 11/605,237

(22) Filed: Nov. 29, 2006

(65) Prior Publication Data

US 2007/0120781 A1   May 31, 2007

(30) Foreign Application Priority Data

Nov. 30, 2005   (KR) .................. 10-2005-0116001

(51) Int. Cl.
  *G09G 3/30*   (2006.01)
(52) U.S. Cl. .......... 345/690; 345/204; 345/76; 341/110; 341/126; 341/144; 341/145
(58) Field of Classification Search .................. 345/204, 345/76, 690
See application file for complete search history.

(56) References Cited

U.S. PATENT DOCUMENTS

| | | | |
|---|---|---|---|
| 5,719,591 A | 2/1998 | Callahan, Jr. | |
| 5,726,676 A | 3/1998 | Callahan, Jr. | |
| 5,877,717 A * | 3/1999 | Tu et al. | 341/150 |
| 6,225,931 B1 * | 5/2001 | Rao et al. | 341/144 |
| 6,281,826 B1 * | 8/2001 | Kimura | 341/150 |
| 6,469,647 B1 * | 10/2002 | Kinugasa et al. | 341/145 |
| 6,556,162 B2 | 4/2003 | Brownlow et al. | |
| 6,633,287 B1 | 10/2003 | Yatabe et al. | |
| 6,970,121 B1 * | 11/2005 | Sun | 341/144 |
| 7,307,610 B2 | 12/2007 | Sakaguchi | |
| 7,310,092 B2 * | 12/2007 | Imamura | 345/204 |
| 7,432,882 B2 | 10/2008 | Kosaka et al. | |
| 7,642,620 B2 | 1/2010 | Tanaka | |
| 2002/0041245 A1 * | 4/2002 | Brownlow et al. | 341/145 |
| 2003/0141998 A1 * | 7/2003 | Matsui | 341/145 |
| 2003/0156104 A1 * | 8/2003 | Morita | 345/204 |
| 2004/0113880 A1 | 6/2004 | Honda | |

(Continued)

FOREIGN PATENT DOCUMENTS

CN   1 335 682 A   2/2002

(Continued)

OTHER PUBLICATIONS

Matsueda, Yojiro, et al, "38.4: 6-bit AMOLED with RGB Adjustable Gamma Compensation LTPS TFT Circuit", SID 05 Digest, pp. 1352-1355 (Jan. 1, 2005).

*Primary Examiner* — Alexander S Beck
*Assistant Examiner* — Grant Sitta
(74) *Attorney, Agent, or Firm* — Lee & Morse, P.C.

(57) ABSTRACT

A data driver, including a first digital-to-analog converter configured to select two reference voltages of a plurality of reference voltages depending on upper bits of data, and a second digital-to-analog converter configured to divide the two reference voltages into a plurality of voltages and supply any one voltage of the two reference voltages and the divided voltages to an output terminal as a data signal depending on lower bits of the data, wherein the second digital-to-analog converter is configured to supply an intermediate gray scale voltage to the output terminal prior to supplying the data signal, the intermediate gray scale voltage having a voltage between the two reference voltages.

15 Claims, 9 Drawing Sheets

U.S. PATENT DOCUMENTS

| | | |
|---|---|---|
| 2004/0174355 A1 | 9/2004 | Taguchi et al. |
| 2004/0227713 A1* | 11/2004 | Sun .................................. 345/98 |
| 2005/0116967 A1* | 6/2005 | Shirasaki et al. ............. 345/690 |

FOREIGN PATENT DOCUMENTS

| | | |
|---|---|---|
| CN | 1 453 758 A | 11/2003 |
| GB | 2 362 277 A | 11/2001 |
| JP | 61-005626 A | 1/1986 |
| JP | 09-505904 A | 6/1997 |
| JP | 11-064825 A | 3/1999 |
| JP | 2002-026732 A | 1/2002 |
| JP | 2003-084720 A | 3/2003 |
| JP | 2003-233361 A | 8/2003 |
| JP | 2004-020325 A | 1/2004 |
| JP | 2004-184570 | 7/2004 |
| JP | 2004-295103 A | 10/2004 |
| KR | 10-2003-0068480 | 8/2003 |
| KR | 10-2004-0054427 | 6/2004 |
| KR | 10-2006-0108920 | 10/2006 |
| WO | WO 2005-006289 A | 1/2005 |

* cited by examiner

DATA DRIVER, ORGANIC LIGHT EMITTING DISPLAY, AND METHOD OF DRIVING THE SAME

BACKGROUND OF THE INVENTION

1. Field of the Invention

The present invention relates to a data driver, an organic light emitting display, and a method of driving the same. More particularly, the present invention relates to a data driver having an enhanced driving speed, an organic light emitting display, and a method of driving the same.

2. Description of the Related Art

Various flat panel display devices having reduced weight and volume compared to cathode ray tubes (CRTs) have been developed. These flat panel display devices include, e.g., a liquid crystal display, a field emission display, a plasma display panel, a light emitting display, etc. These exemplary displays operate differently to display an image.

For example, an organic light emitting display may display an image by using an organic light emitting diode that generates light by recombining electrons and holes. During operation, the organic light emitting display may supply a current corresponding to a data signal to organic light emitting diodes by employing driving, thin film transistors formed at each pixel so light may be emitted from the organic light emitting diodes. The organic light emitting display may offer certain advantages, since it may be operated with low power consumption and may provide a rapid response speed.

The organic light emitting display may generate data signals by using data supplied from an external source. The organic light emitting display may supply the generated data signals to pixels and display an image of desired brightness. A data driver for converting the data supplied from the external source into the data signals has been considered.

The data driver may include a data signal generator for converting the external data into the data signals. The data signal generator may include a digital-to-analog converter (hereinafter, referred to as "DAC"). The DAC may be positioned in each channel and may convert the data into the data signals. For example, the data signal generator may include first DACs generating voltages depending on the values of the upper bits of the data and second DACs for generating voltages depending on the values of the lower bits of the data.

FIG. 1 illustrates a circuit diagram of a conventional second DAC. Referring to FIG. 1, the second DAC 2 may receive a first reference voltage (ref1) and a second reference voltage (ref2) from a first DAC (not illustrated). The first DAC may receive a plurality of reference voltages from an external source. The first DAC may select the first reference voltage (ref1) and the second reference voltage (ref2) among the plurality of reference voltages received depending on a value of the upper bits of the data. The first DAC may supply the selected first and second reference voltages (ref1) and (ref2) to the second DAC 2 via a tenth switch SW10 and an eleventh switch SW11, as illustrated in FIG. 1. The tenth switch SW10 or the eleventh switch SW11 may be turned on depending on the value of the upper bits of the data. For the sake of discussion, assume that the first reference voltage (ref1) is lower than the second reference voltage (ref2).

The second DAC 2 may include a plurality of voltage dividing resistors R1 to R7 for dividing the voltage values of the first reference voltage (ref1) and the second reference voltage (ref2). The second DAC 2 may also include a plurality of switches SW1 to SW8 for supplying voltages divided from the voltage dividing resistors R1 to R7 to an output terminal (out).

A tenth resistor R10 may be arranged between the eleventh switch SW11 and the seventh resistor R7. The tenth resistor R10 may compensate for the switch resistances of the tenth switch SW10 and the eleventh switch SW11, so that the second DAC 2 may evenly divide the reference voltages via the voltage dividing resistors R1 to R7. That is, the resistance of the tenth resistor R10 may be calculated by summing the switch resistance value (i.e., a turn-on resistance value) of the tenth switch SW10 and the switch resistance value of the eleventh switch SW11. The tenth resistor R10 may have a resistance approximate to the resistance of the seventh resistor R7.

The voltage dividing resistors R1 to R7 may be arranged in series. The voltage dividing resistors R1 to R7 may evenly divide the first reference voltage (ref1) and the second reference voltage (ref2). In this regard, the resistance of each of the voltage dividing resistors R1 to R7 may be identical. Further, although FIG. 1 illustrates seven voltage dividing resistors R1 to R7, and assumes that the number of bits of the lower bits of the data is 3, the number of voltage dividing resistors may be different depending on the number of bits of the lower bits of the data.

The switches SW1 to SW8 may be arranged to supply the voltages divided by the voltage dividing resistors R1 to R7 to the output terminal (out). In particular, the first switch SW1 may be arranged between a first node N1 and the output terminal (out) to supply the second reference voltage (ref2) to the output terminal (out). The second switch SW2 may be arranged between a second node N2 and the output terminal (out) to supply the voltage value of the second node N2 to the output terminal (out). The third switch SW3 may be arranged between a third node N3 and the output terminal (out) to supply the voltage value of the third node N3 to the output terminal (out). The fourth switch SW4 may be arranged between a fourth node N4 and the output terminal (out) to supply the voltage value of the fourth node N4 to the output terminal (out). The fifth switch SW5 may be arranged between a fifth node N5 and the output terminal (out) to supply the voltage value of the fifth node N5 to the output terminal (out). The sixth switch SW6 may be arranged between a sixth node N6 and the output terminal (out) to supply the voltage value of the sixth node N6 to the output terminal (out). The seventh switch SW7 may be arranged between a seventh node N7 and the output terminal (out) to supply the voltage value of the seventh node N7 to the output terminal (out). The eighth switch SW8 may be arranged between an eighth node N8 and the output terminal (out) to supply the first reference voltage (ref1) to the output terminal (out).

One of the switches SW1 to SW8 may be turned on depending on the lower bits of the data. That is, any one of the switches SW1 to SW8 may be turned on depending on the value of the lower bits of the data, and a predetermined voltage may be supplied to the output terminal (out). The predetermined voltage supplied to the output terminal (out) may be supplied to pixels as a data signal.

However, in the organic light emitting display illustrated in FIG. 1, the predetermined voltage supplied to the output terminal (out) of the second DAC 2 is generated based on a reference voltage being supplied through at least one voltage dividing resistor and one switch. Therefore, the driving speed of the second DAC 2 may be significantly reduced. In other words, since the predetermined voltage is generated via the voltage dividing resistors R1 to R7, a period of time is required before voltages corresponding to the data signals may be supplied to the pixels. This additional time period may result in a driving speed that is undesirably low.

Additionally, it is preferable that the voltages corresponding to the data signals be charged in the pixels within one horizontal period. However, in the case that voltages corresponding to data signals are supplied via the voltage dividing resistors R1 to R7, as illustrated in FIG. 1, a problem may arise since sufficient voltages may not be charged in the pixels within the required period of time, e.g., one horizontal period.

SUMMARY OF THE INVENTION

The present invention is therefore directed to a data driver, an organic light emitting display, and a method of driving the same that substantially overcome one or more of the problems due to the limitations and disadvantages of the related art.

It is therefore a feature of an exemplary embodiment of the present invention to provide a data driver and an organic light emitting display that include a circuit arrangement which may enhance driving speed.

It is therefore another feature of an exemplary embodiment of the present invention to provide a data driver and an organic light emitting display that include a circuit arrangement which may enhance precision of a gray scale.

At least one of the above and other features and advantages of the present invention may be realized by providing a data driver, including a first digital-to-analog converter configured to select two reference voltages of a plurality of reference voltages depending on upper bits of data, and a second digital-to-analog converter configured to divide the two reference voltages into a plurality of voltages and supply any one voltage of the two reference voltages and the divided voltages to an output terminal as a data signal depending on lower bits of the data, wherein the second digital-to-analog converter is configured to supply an intermediate gray scale voltage to the output terminal prior to supplying the data signal, the intermediate gray scale voltage having a voltage between the two reference voltages.

The first digital-to-analog converter may include a tenth switch and an eleventh switch that are configured to be turned on to supply the two reference voltages of the plurality of reference voltages. The second digital-to-analog converter may include a plurality of voltage dividing resistors arranged between the tenth switch and the eleventh switch of the first digital-to-analog converter to divide the two reference voltages, first switches arranged between nodes of the voltage dividing resistors and the output terminal and configured to be turned on depending on lower bits of the data, a second switch arranged between the tenth switch and the output terminal or the eleventh switch and the output terminal, and a first electrode of a capacitor connected to the second switch and the output terminal.

The eleventh switch may be connected to a first reference voltage of the two reference voltages, and the tenth switch may be connected to a second reference voltage having a voltage higher than the first reference voltage. The second switch may be arranged directly between the eleventh switch and the output terminal. The second switch may be arranged directly between the tenth switch and the output terminal.

A second electrode of the capacitor may be configured to receive a variation voltage, and the capacitor may be configured to be charged to a voltage level substantially equal to an intermediate gray scale voltage. The second digital-to-analog converter may further include a compensation resistor arranged between the tenth switch and the voltage dividing resistors to compensate for the resistance values of the tenth switch and the eleventh switch. The second digital-to-analog converter may further include a compensation resistor arranged between the eleventh switch and the voltage dividing resistors to compensate for the resistance values of the tenth switch and the eleventh switch. The compensation resistor may have a resistance value substantially equal to any one of the voltage dividing resistors.

The data driver may include a shift register configured to supply sampling signals in sequence, a sampling latch unit configured to sample data in response to the sampling signals, a holding latch unit configured to store data from the sampling latch unit, and a data signal generator configured to receive the data from the holding latch unit and generate the data signal, wherein each channel of the data signal generator may be provided with the first digital-to-analog converter and the second digital-to-analog converter.

The data driver may further include a level shifter arranged between the holding latch unit and the data signal generator and configured to raise a voltage level of the data, and a buffer unit configured to receive the data signal from the data signal generator.

At least one of the above and other features and advantages of the present invention may also be realized by providing an organic light emitting display, comprising a pixel unit including a plurality of pixels connected to scan lines and data lines, a scan driver configured to drive the scan lines, and a data driver configured to drive the data lines, wherein the data driver includes a first digital-to-analog converter configured to select two reference voltages of a plurality of reference voltages depending on upper bits of data, and a second digital-to-analog converter configured to divide the two reference voltages into a plurality of voltages and supply any one voltage of the two reference voltages and the divided voltages to an output terminal as a data signal depending on lower bits of data, wherein the second digital-to-analog converter is configured to supply an intermediate gray scale voltage to the output terminal prior to supplying the data signal, the intermediate gray scale voltage having a voltage between the two reference voltages.

The second digital-to-analog converter may include voltage dividing resistors configured to divide the two reference voltages, first switches configured to supply any one voltage of the voltage values divided by the voltage dividing resistors depending on lower bits of the data, a second switch configured to supply any one voltage of the two reference voltages to the output terminal without passing through the voltage dividing resistors, and a capacitor having a first electrode connected to the second switch and the output terminal, and having a second electrode connected to a variation voltage.

The data driver may include a shift register configured to supply sampling signals in sequence, a sampling latch unit configured to sample data in response to the sampling signals, a holding latch unit configured to store data from the sampling latch unit; and a data signal generator configured to receive the data from the holding latch unit and generate the data signal, wherein each channel of the data signal generator is provided with the first digital-to-analog converter and the second digital-to-analog converter. The data driver may further include a level shifter arranged between the holding latch unit and the data signal generator and configured to raise a voltage level of the data, and a buffer unit configured to receive the data signal from the data signal generator.

At least one of the above and other features and advantages of the present invention may further be realized by providing a method of driving an organic light emitting display, including selecting two reference voltages of a plurality of reference voltages depending on upper bits of data, dividing the two reference voltages into a plurality of voltages, supplying any one of the two reference voltages to an output terminal during a first period of a horizontal period, supplying an intermediate gray scale voltage between the two reference voltages to the output terminal at the beginning of a second period of the horizontal period, and supplying any one of the divided voltages and the two reference voltages to the output terminal as a data signal depending on lower bits of the data during the remainder of the second period.

In supplying any one of the two reference voltages to the output terminal, the reference voltage may not be passed through voltage dividers. Supplying the intermediate gray scale voltage may include supplying a variation voltage to a capacitor connected to the output terminal. Supplying the variation voltage to the capacitor may include setting a voltage of the variation voltage so that the voltage of the output terminal during the first period is changed to the intermediate gray scale voltage at the beginning of the second period.

The variation voltage may include a first voltage during the first period and a second voltage during the second period, and the two reference voltages include a first reference voltage and a second reference voltage, the second reference voltage being higher than the first reference voltage, supplying any one of the two reference voltages may include supplying the first reference voltage to the output terminal without passing through voltage dividers, and supplying the variation voltage to the capacitor may include setting the second voltage to be higher than the first voltage during the second period so as to increase the voltage of the output terminal to the intermediate gray scale voltage.

The variation voltage may include a first voltage during the first period and a second voltage during the second period, and the two reference voltages include a first reference voltage and a second reference voltage, the second reference voltage being higher than the first reference voltage, supplying any one of the two reference voltages may include supplying the second reference voltage to the output terminal without passing through voltage dividers, and supplying the variation voltage to the capacitor may include setting the second voltage to be lower than the first voltage during the second period so as to decrease the voltage of the output terminal to the intermediate gray scale voltage.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
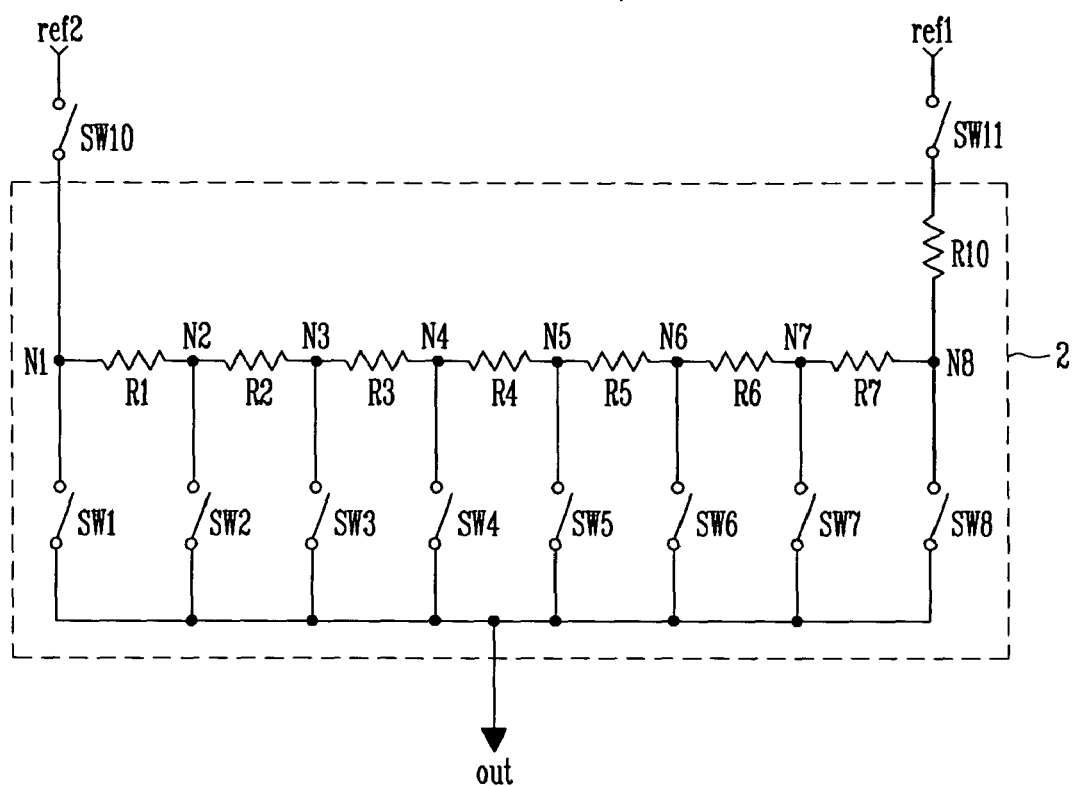
FIG. 1 illustrates a circuit diagram of a conventional second DAC.

Korean Patent Application No. 10-2005-0116001, filed on Nov. 30, 2005, in the Korean Intellectual Property Office, and entitled: "Data Driver and Driving Method of Organic Light Emitting Display Using the Same," is incorporated by reference herein in its entirety.

The present invention will now be described more fully hereinafter with reference to the accompanying drawings, in which exemplary embodiments of the present invention are illustrated. The present invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

Hereinafter, exemplary embodiments according to the present invention, which can be easily carried out by those skilled in the art, will be described with reference to FIGS. 2 through 13.

Figure 2:
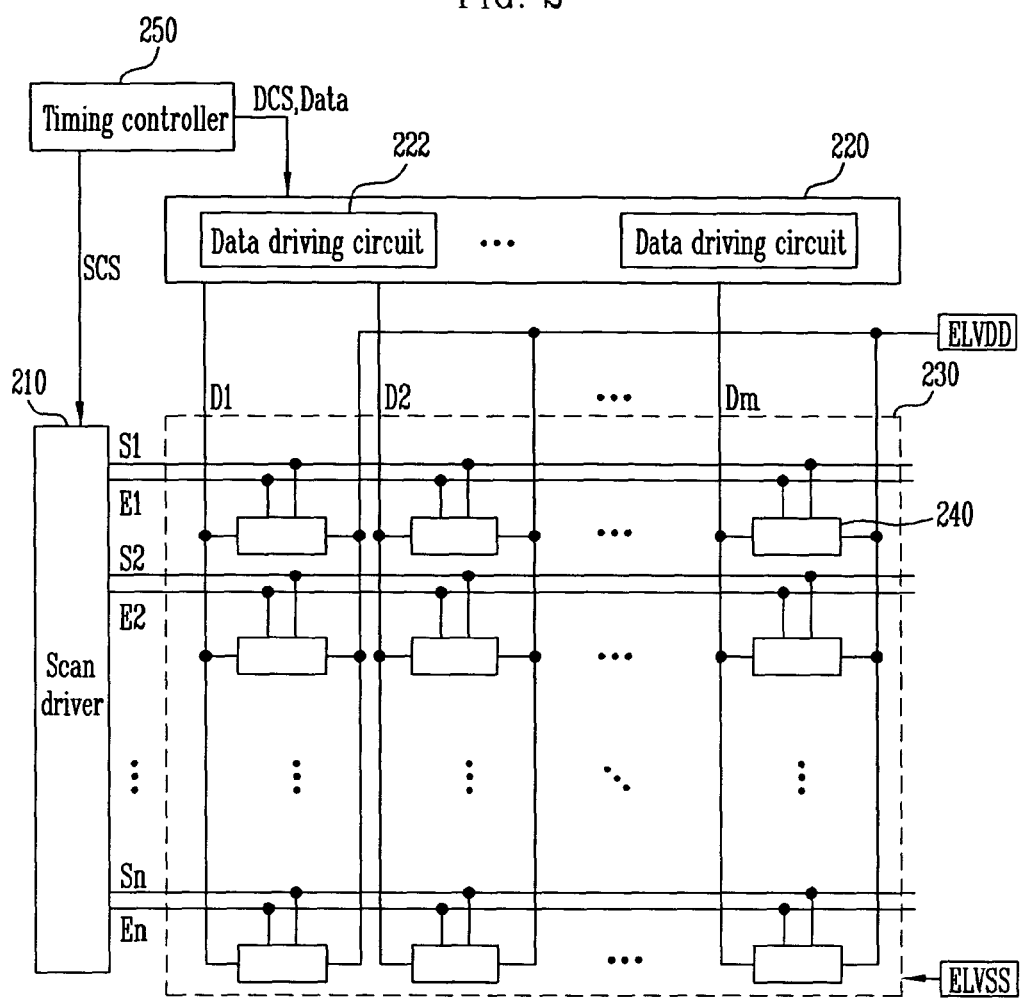
FIG. 2 illustrates a circuit diagram of an organic light emitting display according to an exemplary embodiment of the present invention.

FIG. 2 illustrates a circuit diagram of an organic light emitting display according to an exemplary embodiment of the present invention. Referring to FIG. 2, the organic light emitting display may include a pixel unit 230. The pixel unit 230 may include pixels 240 arranged on regions where scan lines S1 to Sn intersect with data lines D1 to Dm. The organic light emitting display may also include a scan driver 210 for driving scan lines S1 to Sn, a data driver 220 for driving data lines D1 to Dm, and a timing controller 250 for controlling the scan driver 210 and the data driver 220. The data driver 220 may include at least one data driving circuit 222.

The scan driver 210 may generate scan signals in response to scan driving control signals SCS from the timing controller 250. The scan driver 210 may supply the generated scan signals to the scan lines S1 to Sn in sequence. The scan driver 210 may also generate light emitting control signals in response to the scan driving control signals SCS from the timing controller 250. The scan driver 210 may supply the generated light emitting control signals to the light emitting control lines E1 to En in sequence. The data driver 220 may generate data signals in response to data driving control signals DCS from the timing controller 250. The data driver 220 may supply the generated data signals to the data lines D1 to Dm in sequence. The data driving circuit 222 may convert data supplied from an external source into data signals and supply them to the data lines D1 to Dm. A detailed description of the data driving circuit 222 will be discussed later.

The timing controller 250 may generate data driving control signals DCS and scan driving control signals SCS based on synchronization signals supplied from an external source. Data driving control signals DCS and scan driving control signals SCS generated from the timing controller 250 may be supplied to the data driver 220 and to the scan driver 210, respectively. The timing controller 250 may rearrange the data supplied from the external source and may supply the data to the data driver 220.

The pixel unit 230 may receive a first power source ELVDD and a second power source ELVSS from an external source. The first power source ELVDD and the second power source ELVSS supplied to the pixel unit 230 may be respectively supplied to the pixels 240. The pixels 240 may display images corresponding to data signals supplied from the data driving circuit 222.

Figure 3:
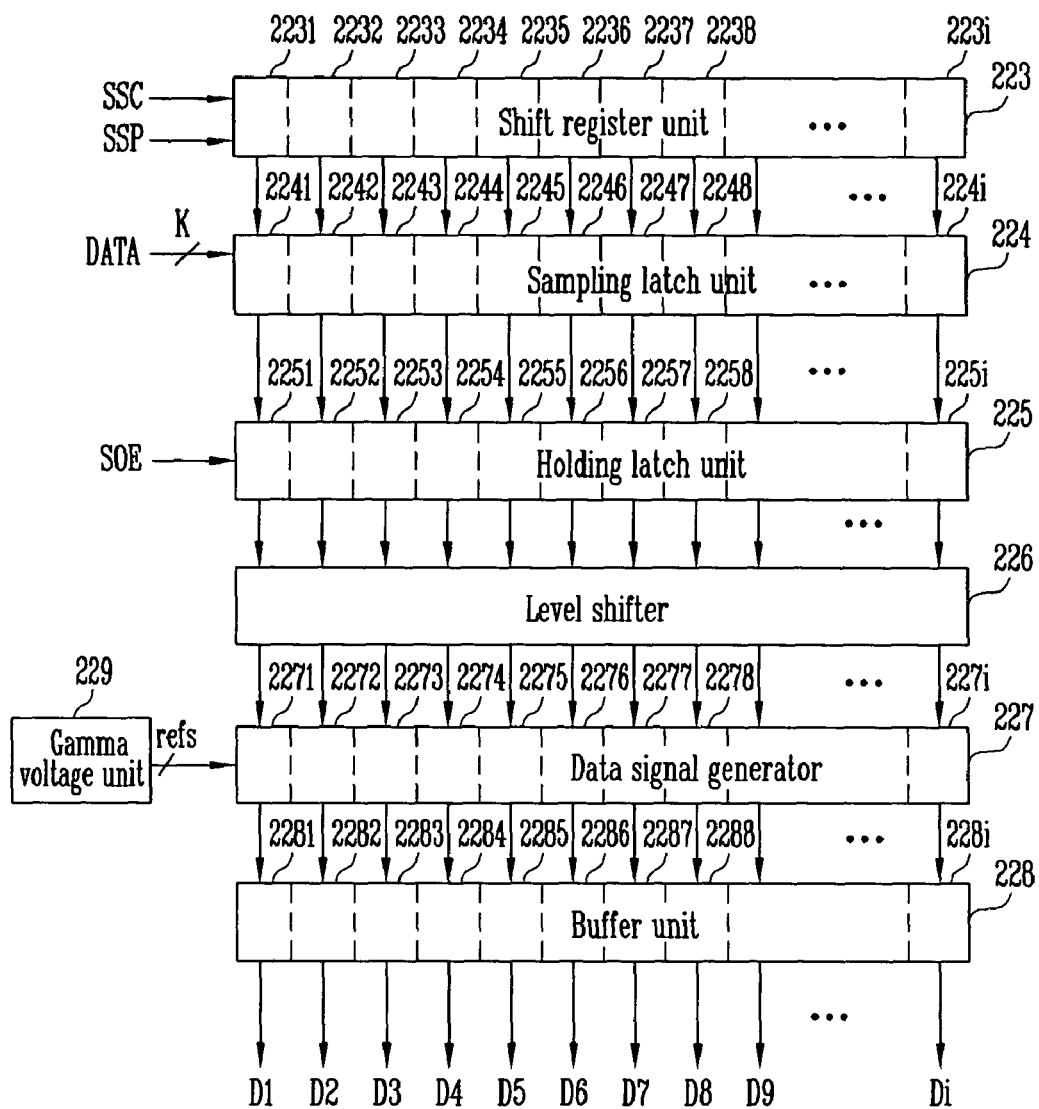
FIG. 3 illustrates a block diagram of an exemplary data driving circuit as illustrated in FIG. 2.

FIG. 3 illustrates a block diagram of an exemplary data driving circuit as illustrated in FIG. 2. For the sake of discussion, FIG. 3 will be described assuming that the data diving circuit 222 includes "i" channels. Referring to FIG. 3, the data driving circuit 222 may include a shift register unit 223 for supplying sampling signals in sequence, a sampling latch unit 224 for storing data in sequence in response to the sampling signals, a holding latch unit 225 for temporarily storing data stored in the sampling latch unit 224 and supplying the stored data to a level shifter 226, a level shifter 226 for raising a voltage level of the data, a data signal generator 227 for generating data signals corresponding to bit values of the data, and a buffer unit for supplying data signals to data lines D1 to Di.

The shift register unit 223 may receive a source shift clock SSC and a source start pulse SSP from the timing controller 250. The shift register unit 223 receiving the source shift clock SSC and the source start pulse SSP may generate "i" sampling signals in sequence, while allowing the source start pulse SSP to be shifted depending on the source shift clock SSC. The shift register unit 223 may include "i" shift registers 2231 to 223i.

The sampling latch unit 224 may store data in sequence depending on the sampling signals supplied in sequence from the shift register unit 223. The sampling latch unit 224 may include "i" sampling latches 2241 to 224i for storing i data. Each size of the sampling latches 2241 to 224i may be set to store k bit data. For the sake of discussion, this exemplary sampling latch unit 224 will be described assuming that k bit is 6 bits.

The holding latch unit 225 may receive and store the data from the sampling latch unit 224 in response to a source output enable SOE signal. The holding latch unit 225 may supply the stored data to a level shifter 226. The holding latch unit 225 may include "i" holding latches 2251 to 225i. Each of the holding latches 2251 to 225i may be configured to store k bit data.

The level shifter 226 may raise a voltage level of the data supplied from the holding latch unit 225. The level shifter 226 may supply the data with a raised voltage level to the data signal generator 227. In this regard, the data driver 220 may receive data having a low voltage level and may raise the voltage level of the data to a high voltage level by employing the level shifter 226.

In other implementations, the data driver may not include the level shifter 226. For example, circuit components necessary to raise the voltage level of the data from a low voltage level to a high voltage level may be arranged external to the data driver 220. Accordingly, the holding latch unit 225 may be directly connected to the data signal generator 227. However, such an arrangement may increase manufacturing expenses.

The data signal generator 227 may generate data signals corresponding to bit values (or gray scale values) of the data. The data signal generator 227 may supply the generated data signals to a buffer unit 228. The data signal generator 227 may receive a plurality of reference voltages (refs) from a gamma voltage unit 229. The data signal generator may generate data signals by using the received reference voltages (refs). The data signal generator 227 will be described in greater detail later.

The gamma voltage unit 229 may supply the plurality of reference voltages (refs) to the data signal generator 227. The gamma voltage unit 229 may be arranged inside or outside of the data driving circuit 222.

The buffer unit 228 may supply data signals supplied from the data signal generator 227 to data lines D1 to Di.

Figure 4:
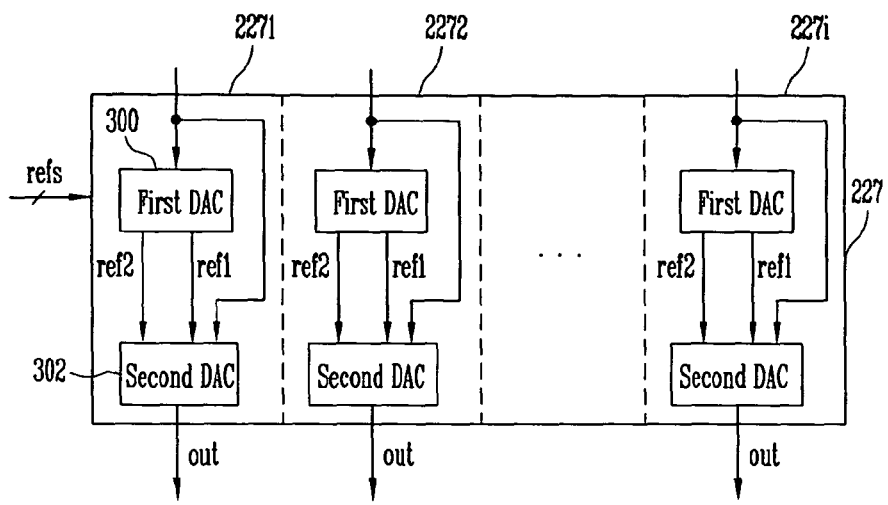
FIG. 4 illustrates a block diagram of an exemplary data signal generator as illustrated in FIG. 3.

FIG. 4 illustrates a block diagram of an exemplary data signal generator as illustrated in FIG. 3. Referring to FIG. 4, the data signal generator 227 may include a first DAC 300 and a second DAC 302 in each channel 2271 to 227i. For the sake of discussion, this exemplary data signal generator will be described assuming that nine reference voltages (refs) are supplied from the gamma voltage unit 229.

The first DAC 300 may select a first reference voltage (ref1) and a second reference voltage (ref2) of the reference voltages (refs) depending on, e.g., a value of upper bits of the data supplied from the level shifter 226. In another implementation, previously discussed above, the first DAC 300 may receive the data directly from the holding latch unit 225.

The first DAC 300 may supply the first reference voltage (ref1) and the second reference voltage (ref2) to the second DAC 302. That is, the first DAC 300 may extract two reference voltages of the nine reference voltages (refs) depending on the bit values of, for example, an upper 3 bits of the data. The first DAC 300 may supply the extracted two reference voltages to the second DAC 302 as the first reference voltage (ref1) and the second reference voltage (ref2). Hereinafter, for the sake of discussion, assume that the first reference voltage (ref1) is set to be lower than the second reference voltage (ref2).

The second DAC 302 may divide the first reference voltage (ref1) and the second reference voltage (ref2) into a plurality of voltages. The second DAC 302 may supply any one of the first reference voltage (ref1), the second reference voltage (ref2) and the divided voltages to the output terminal (out) as a data signal, depending on the value of the lower 3 bits of the data.

Figure 5:
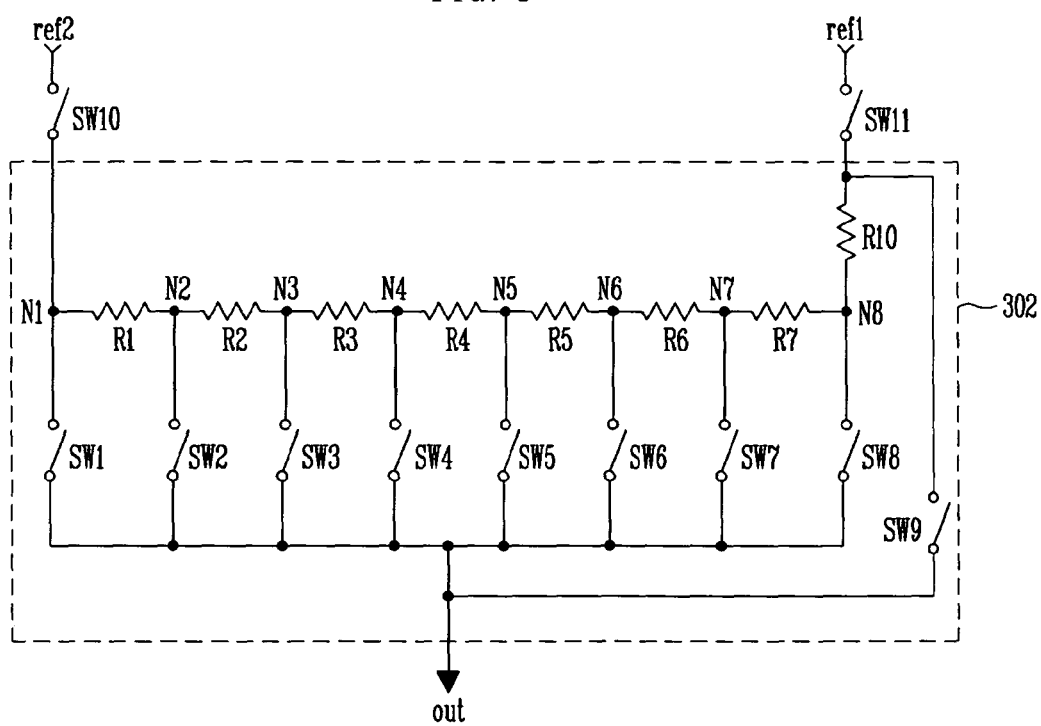
FIG. 5 illustrates a circuit diagram of a first exemplary embodiment of a second DAC as illustrated in FIG. 4.

FIG. 5 illustrates a circuit diagram of a second DAC according to a first exemplary embodiment of the present invention. A tenth switch SW10 and an eleventh switch SW11 of the first DAC 300 is also illustrated in FIG. 5. The tenth switch SW10 and the eleventh switch SW11 may be turned on to supply the first reference voltage (ref1) and the second reference voltage (ref2) to the second DAC 302.

Referring to FIG. 5, the second DAC 302 may include a plurality of voltage dividing resistors R1 to R7 for dividing the first reference voltage (ref1) and the second reference voltage (ref2), and a plurality of switches SW1 to SW8 for supplying the voltages divided from the voltage dividing resistors R1 to R7 to the output terminal (out). The second DAC 302 may also include a tenth resistor R10 and a switch SW9.

The voltage dividing resistors R1 to R7 may be arranged in series between inputs for receiving the first reference voltage (ref1) and the second reference voltage (ref2). In this regard, the voltage dividing resistors R1 to R7 may divide the voltage values of the first reference voltage (ref1) and the second reference voltage (ref2). Additionally, the voltage dividing resistors R1 to R7 may have identical resistance values. While this exemplary embodiment of the second DAC may include seven voltage dividing resistors R1 to R7, on the assumption that the number of the lower bits of the data is 3 bits, the present invention is not limited thereto. That is, the number of voltage dividing resistors may be different.

The switches SW1 to SW8 may be connected to a node of the voltage dividing resistors R1 to R7 so as to supply the voltages divided by the voltage dividing resistors R1 to R7 to the output terminal (out).

For example, the first switch SW1 may be arranged between a first node N1 and the output terminal (out) and may supply the second reference voltage (ref2) to the output terminal (out). The second switch SW2 may be arranged between a second node N2 and the output terminal (out) and may supply the voltage value of the second node N2 to the output terminal (out). The third switch SW3 may be arranged between a third node N3 and the output terminal (out) and may supply the voltage value of the third node N3 to the output terminal (out). The fourth switch SW4 may be arranged between a fourth node N4 and the output terminal (out) and may supply the voltage value of the fourth node N4 to the output terminal (out). The fifth switch SW5 may be arranged between a fifth node N5 and the output terminal (out) and may supply the voltage value of the fifth node N5 to the output terminal (out). The sixth switch SW6 may be arranged between a sixth node N6 and the output terminal (out) and may supply the voltage value of the sixth node N6 to the output terminal (out). The seventh switch SW7 may be arranged between a seventh node N7 and the output terminal (out) and may supply the voltage value of the seventh node N7 to the output terminal (out). The eighth switch SW8 may be arranged between an eighth node N8 and the output terminal (out) and may supply the first reference voltage (ref1) to the output terminal (out).

Any one of the switches SW1 to SW8 may be turned on depending on the lower 3 bits of the data. That is, any one of the switches SW1 to SW8 may be turned on depending on value of the lower 3 bits of the data, and a predetermined voltage value may be supplied to the output terminal (out). The voltage supplied to the output terminal (out) may be supplied to the pixels 240 as a data signal via the buffer unit 228.

As discussed above, the second DAC 302 may include the tenth resistor R10 that may be arranged between the eleventh switch SW11 and the seventh voltage dividing resistor R7. The tenth resistor R10 may compensate for the switch resistances of the tenth switch SW10 and the eleventh switch SW11 so that the second DAC 302 may evenly divide the reference voltages by employing the voltage dividing resistors R1 to R7. That is, the resistance of the tenth resistor R10 may be calculated by summing the switch resistance value (i.e., a turn-on resistance value) of the tenth switch SW10 and the switch resistance value of the eleventh switch SW11. The tenth resistor R10 may have a resistance approximate to the seventh resistor R7.

The second DAC 302 may also include the ninth switch SW9 that may be arranged between the eleventh switch SW11 and the output terminal (out). The ninth switch SW9 may be turned on before the data signal is supplied to the output terminal (out) so as to initially charge the pixels 240 with the voltage value of the reference voltage (ref1). That is, the first reference voltage (ref1) may be supplied via the ninth switch SW9 to the pixels 240 without passing through the voltage dividing resistors R1 to R7, and the tenth resistor R10, thereby making it possible to reduce the charging time of the pixels 240.

Figure 6:
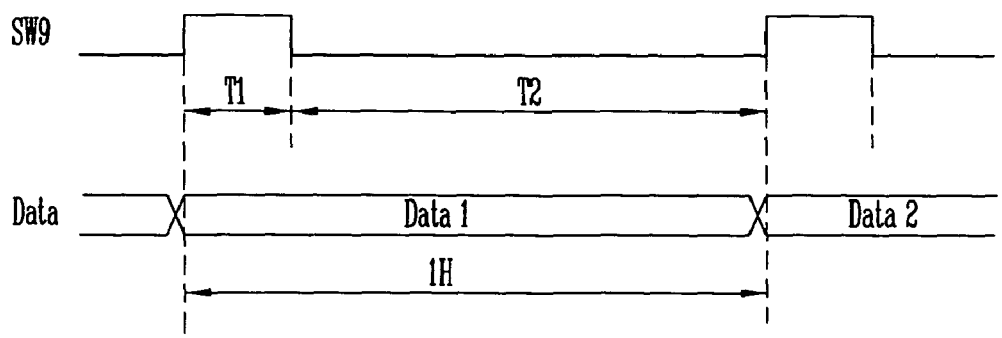
FIG. 6 illustrates an exemplary timing diagram of an operation of the second DAC as illustrated in FIG. 5.
Figure 7:
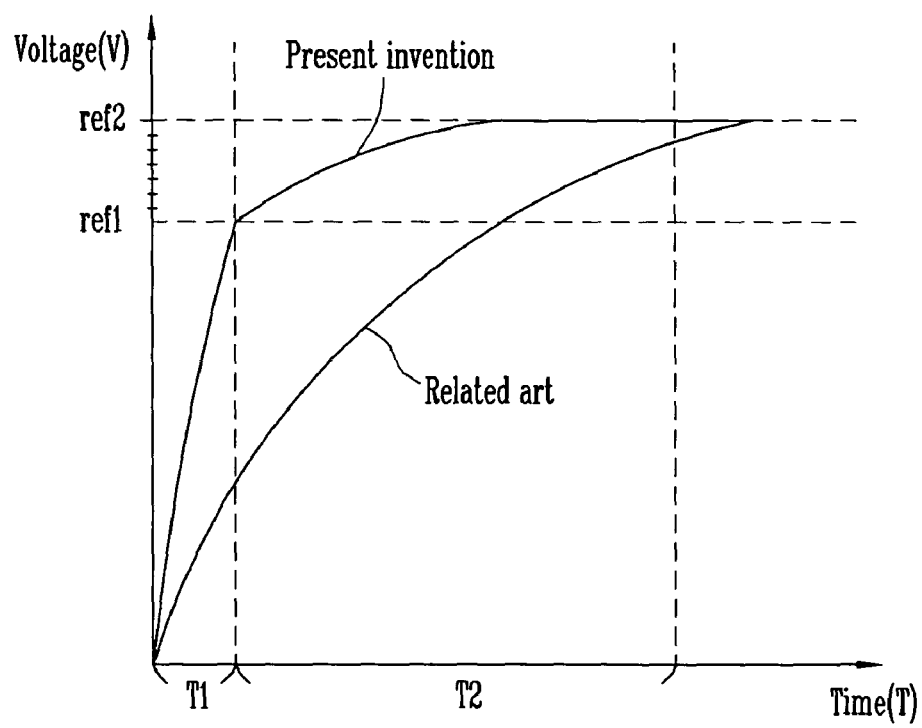
FIG. 7 illustrates a graph of an exemplary output voltage of the second DAC as illustrated in FIG. 5.

FIG. 6 illustrates an exemplary timing diagram of an operation of the second DAC as illustrated in FIG. 5. Referring to FIG. 5 and FIG. 6, during a first period T1 of a horizontal period 1H, the ninth switch SW9 may be turned on. If the ninth switch SW9 is turned on, the first reference voltage (ref1) may be supplied to the pixels 240 via the output terminal of the second DAC 302 and the buffer unit 228. That is, the first reference voltage (ref1) may be supplied during the first period T1 to the pixels 240 without passing through the voltage dividing resistors R1 to R7 and the tenth resistor R10 of the second DAC 302. Thus, the first reference voltage (ref1) may be charged in the pixels 240 at a rapid charging speed during the first period T1, as illustrated in FIG. 7. Accordingly, the charging speed of the pixels 240 may be significantly enhanced.

During a second period T2 of the horizontal period 1H, the ninth switch SW9 may be turned off, and any one of the switches SW1 to SW8 may be turned on. The turned-on switch may supply a predetermined voltage to the output terminal (out) of the second DAC 302. The predetermined voltage outputted may be supplied to the pixels 240 as a data signal.

The first reference voltage (ref1) may be supplied to the pixels 240 during the first period T1, and the voltage corresponding to the data signal may be charged during the second period T2. Thus, even though during the second period T2, the voltage may be supplied to the output terminal (out) via the voltage dividing resistors R1 to R7, and the charging speed of the pixels 240 may not be as rapid as the charging speed of the pixels 240 during the first period T1, when the first reference voltage (ref1) is supplied to the output terminal (out) via the ninth switch SW9, a voltage corresponding to a data signal may be charged in the pixels 240 more rapidly due to the voltage previously charged in the pixels 240 during the first period T1. In this regard, the voltage corresponding to the data signal may be charged in the pixels 240 within the horizontal period 1H.

In the second DAC 302 as illustrated in FIG. 5, it may be somewhat difficult to supply an intermediate gray scale voltage to the output terminal (out) prior to supplying the data signal. The intermediate gray scale voltage may be a voltage between the first reference voltage (ref1) and the second reference voltage (ref2). That is, when supplying the intermediate gray scale voltage via the voltage dividing resistors R1 to R7, the total resistance thereof may be significant, and may prevent a necessary voltage being charged in the pixels 240. Accordingly, when generating a voltage corresponding to a data signal by employing the voltage dividing resistors R1 to R7, it may be desirable to enhance the precision of the gray scale levels of the data signal generated in the intermediate portions of the voltage dividing resistors R1 to R7.

Figure 8:
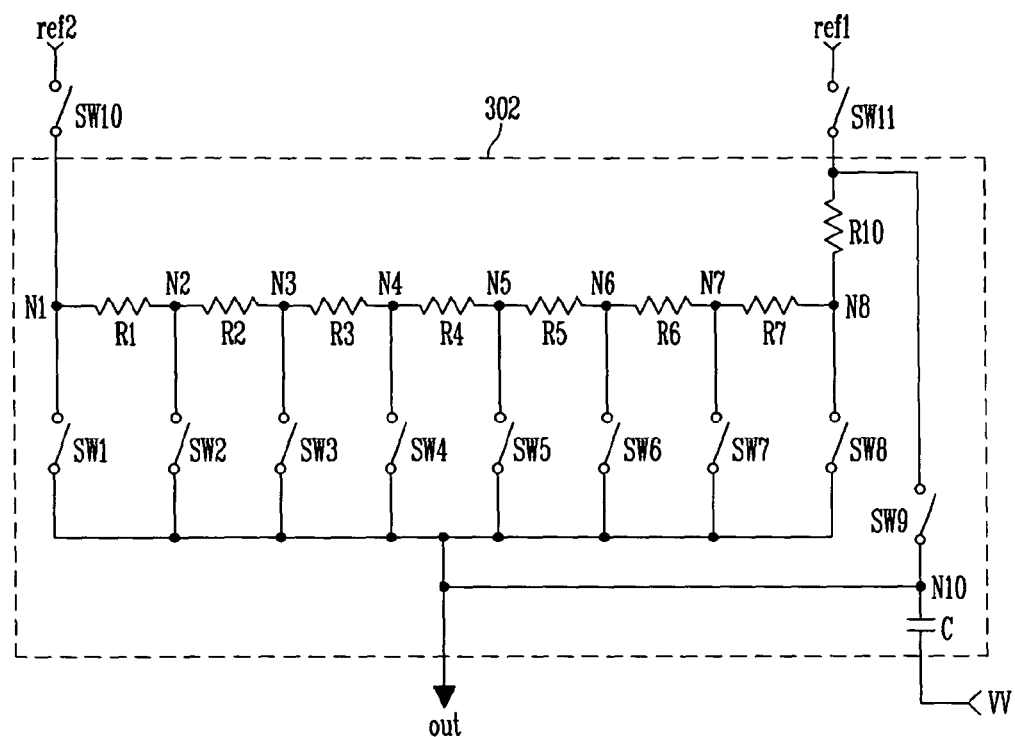
FIG. 8 illustrates a circuit diagram of a second exemplary embodiment of a second DAC as illustrated in FIG. 4.

FIG. 8 illustrates a circuit diagram of a second DAC according to a second exemplary embodiment of the present invention. In FIG. 8 the same elements illustrated in FIG. 5 have been designated by the same reference numerals, and a detailed description thereof will not be repeated. Referring to FIG. 8, the second DAC 302 may include a capacitor C. The first electrode of the capacitor C may be connected to the tenth node N10. The tenth node N10 may be a common node between the ninth switch SW9 and the output terminal (out). The second electrode of the capacitor C may receive a variation voltage W. In an exemplary operation, the capacitor C may change the voltage of the output terminal (out) to an intermediate gray scale voltage of the first reference voltage (ref1) and the second reference voltage (ref2). That is, after the ninth switch SW9 is turned on to supply the first reference voltage (ref1) to the output terminal (out), the capacitor C may supply the intermediate gray scale voltage to the output terminal (out). The intermediate gray scale voltage may be between the first reference voltage (ref1) and the second reference voltage (ref2). Accordingly, the intermediate gray scale voltage may be rapidly charged in the pixels 240.

Figure 9:
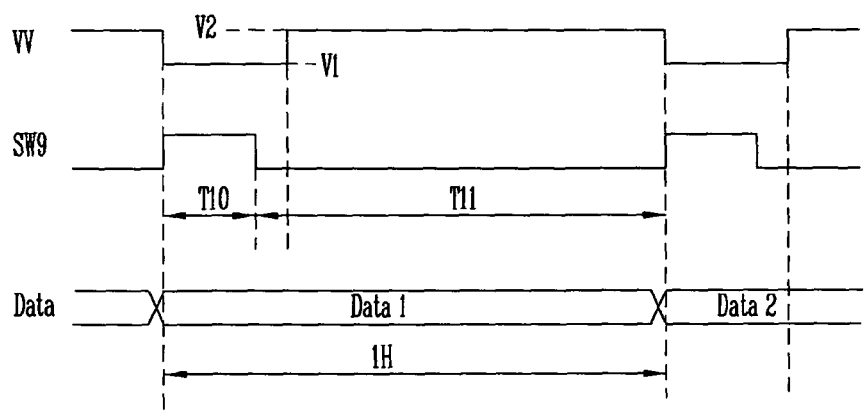
FIG. 9 illustrates an exemplary timing diagram of an operation of the second DAC as illustrated in FIG. 8.
Figure 10:
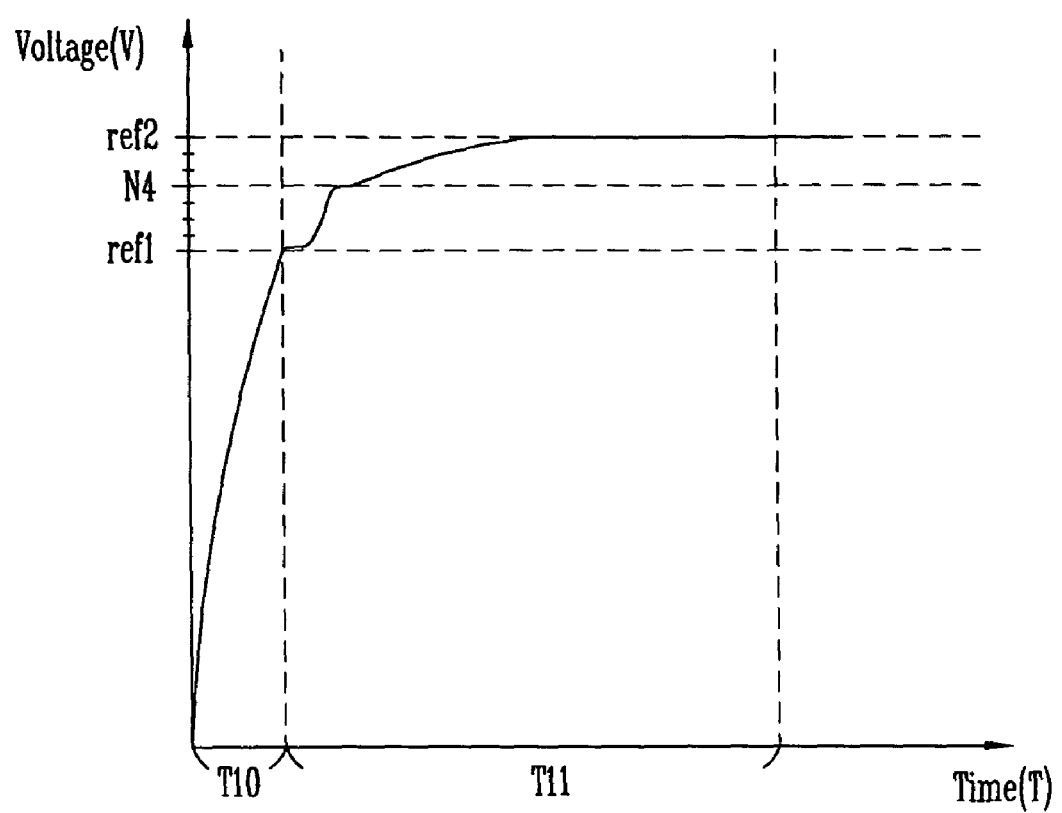
FIG. 10 illustrates a graph of an exemplary output voltage of the second DAC as illustrated in FIG. 8.

FIG. 9 illustrates an exemplary timing diagram of an operation of the second DAC as illustrated in FIG. 8. Referring to FIG. 8 and FIG. 9, during a first period T10 of a horizontal period 1H, the ninth switch SW9 may be turned on. If the ninth switch SW9 is turned on, the first reference voltage (ref1) may be supplied to the pixels 240 via the output terminal (out) of the second DAC 302 and the buffer unit 228. That is, the first reference voltage (ref1) may be supplied during the first period T10 to the pixels 240 without passing through the voltage dividing resistors R1 to R7 and the tenth resistor R10 of the second DAC 302. Thus, the first reference voltage (ref1) may be charged in the pixels 240 at an increased charging speed during the first period T10, as illustrated in FIG. 10. Accordingly, the charging speed of the pixels 240 may be significantly enhanced. Also, during the first period T10, the variation voltage W having a first voltage value V1 may be supplied to the second electrode of the capacitor C.

During a second period T11, the ninth switch SW9 may be turned off, and the variation voltage W having a second voltage value V2 may be supplied to the second electrode of the capacitor C. For the sake of discussion, the second voltage V2 may be higher than the first voltage V1. The second voltage V2 may be set so that the voltage of the output terminal (out) of the second DAC 302 increases from the first reference voltage (ref1) to the intermediate gray scale voltage. In particular, the second voltage V2 may be set so that the charge in the pixels 240 may increase from the first reference voltage (ref1) to the intermediate gray scale voltage. Accordingly, the intermediate gray scale voltage may be charged in the pixels 240.

After the voltage of the output terminal (out) may be increased to the intermediate gray scale voltage, any one of the switches SW1 to SW8 may be turned on. The turned-on switch may supply a predetermined voltage to the output terminal (out). The predetermined voltage may be supplied to the pixels 240 as a data signal via the buffer unit 228. In this regard, the second DAC 302 of this exemplary embodiment may enhance the precision of the intermediate gray scale by changing the voltage of the output terminal (out) to the intermediate gray scale voltage using the capacitor C.

As discussed, if the intermediate gray scale voltage is selected as a voltage corresponding to a data signal, the intermediate gray scale voltage may be stably charged in the pixels 240. Further, if, for example, the second node N2 voltage or the seventh node N7 voltage is selected, the desired voltage may be stably charged in the pixels 240. In other words, the voltage value of the second node N2 or the seventh node N7 may be supplied via one resistor (R1 or R7) to the output terminal (out), and the voltage corresponding to the data signal may be rapidly charged in the pixels 240.

Figure 11:
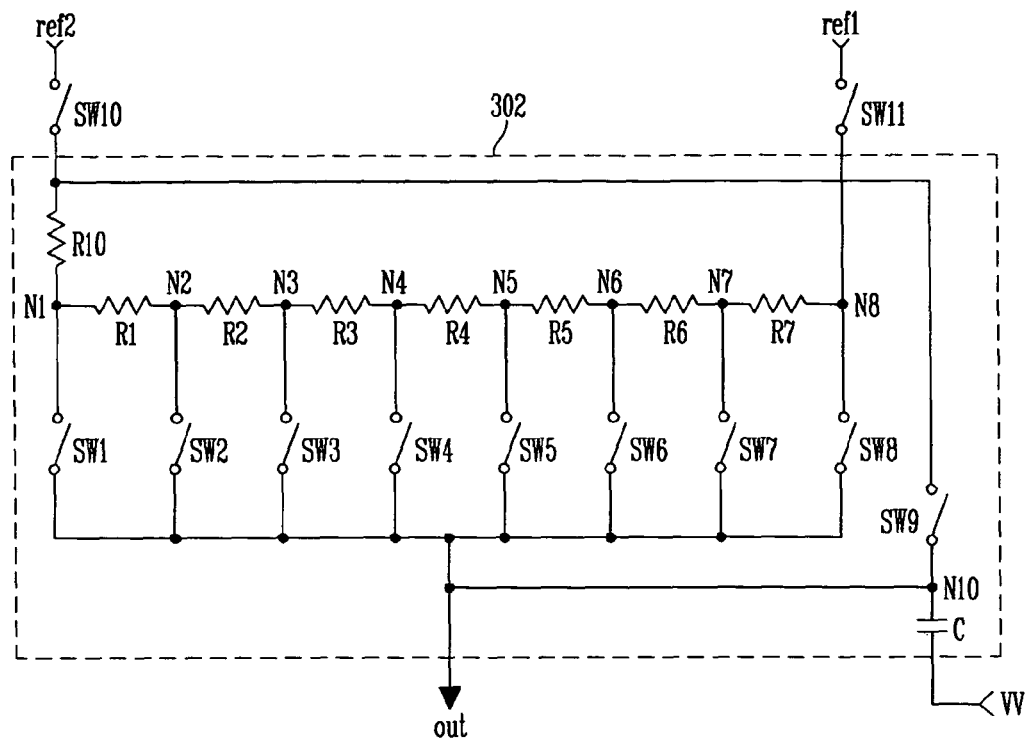
FIG. 11 illustrates a circuit diagram of a third exemplary embodiment of a second DAC as illustrated in FIG. 4.

FIG. 11 illustrates a circuit diagram of a third exemplary embodiment of a second DAC as illustrated in FIG. 4. In FIG. 11, the same elements illustrated in FIG. 8 have been designated by the same reference numerals, and a detailed description thereof will not be repeated. Referring to FIG. 11, the connection arrangement of the ninth switch SW9 and the tenth resistor R10 may be different from the second DAC 302 illustrated in FIG. 8. For example, the ninth switch SW9 may provide a connection path for the second reference voltage (ref2) to the output terminal (out). The tenth resistor R10 may be arranged between the tenth switch SW10 and the first voltage dividing resistor R1. In an exemplary operation, the ninth switch SW9 may be turned on, and the second reference voltage (ref2) may be supplied to the output terminal (out) of the second DAC 302.

Figure 12:
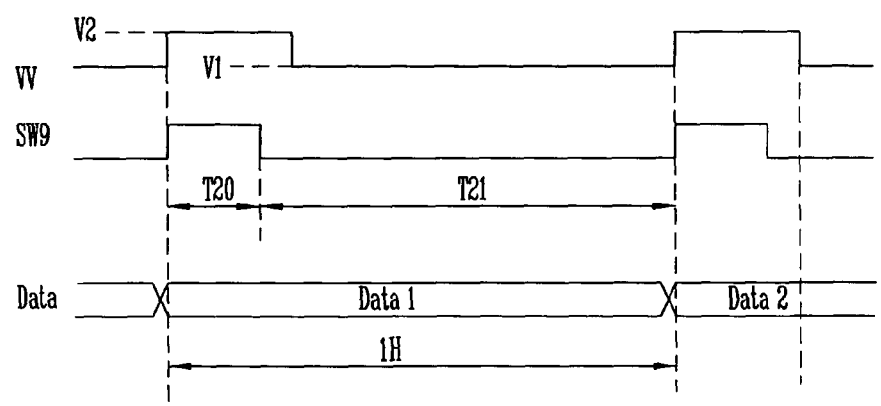
FIG. 12 illustrates an exemplary timing diagram of an operation of the second DAC as illustrated in FIG. 11.

FIG. 12 illustrates an exemplary timing diagram of an operation of the second DAC as illustrated in FIG. 11. Referring to FIG. 11 and FIG. 12, during a first period T20 of a horizontal period 1H, the ninth switch SW9 may be turned on. If the ninth switch SW9 is turned on, the second reference voltage (ref2) may be supplied to the pixels 240 via the output terminal (out) of the second DAC 302 and the buffer unit 228. That is, the second reference voltage (ref2) may be supplied during the first period T20 to the pixels 240 without passing through the voltage dividing resistors R1 to R7 and the tenth resistor R10 of the second DAC 302. Thus, the second reference voltage (ref2) may be charged in the pixels 240 at a rapid charging speed during the first period T20. Accordingly, the charging speed of the pixels 240 may be significantly enhanced. Also, during the first period T20, the variation voltage W having a second voltage value V2 may be supplied to the second electrode of the capacitor C.

During a second period T21, the ninth switch SW9 may be turned off and the variation voltage W having a first voltage value V1 may be supplied to the second electrode of the capacitor C. For the sake of discussion, the first voltage V1 may be lower than the second voltage V2. The first voltage V1 may be set so that the voltage of the output terminal (out) of the second DAC 302 decreases from the second reference voltage (ref2) to the intermediate gray scale voltage. For example, the first voltage V1 may be set so that the voltage of the output terminal (out) decreases from the second reference voltage (ref2) to the voltage of, for example, the fourth node N4 or the fifth node N5.

Accordingly, if the voltage of the output terminal (out) decreases to the intermediate gray scale voltage by employing the capacitor C, the voltage value of the intermediate gray scale value may be rapidly charged in the pixels 240. That is, the second DAC 302 of this exemplary embodiment may enhance the precision of the intermediate gray scale by changing the voltage value of the output terminal (out) to the intermediate gray scale voltage employing the capacitor C.

After the voltage of the output terminal (out) may be decreased to the intermediate gray scale voltage, any one of the switches SW1 to SW8 may be turned on. The turned-on switch may supply a predetermined voltage to the output terminal (out), and may be supplied to the pixels 240 as a data signal via the buffer unit 228.

Figure 13:
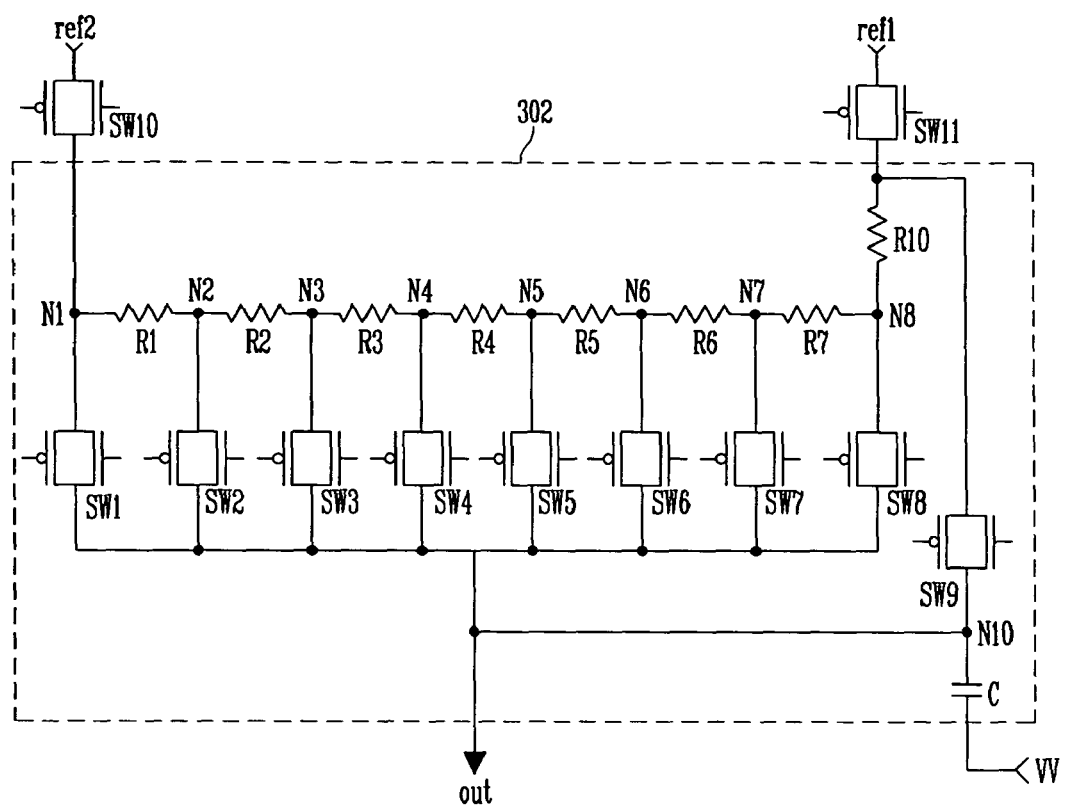
FIG. 13 illustrates a circuit diagram of a fourth exemplary embodiment of a second DAC as illustrated in FIG. 4.

Switches S1 to SW11 may be implemented employing at least one transistor. However, the switches SW1 to SW11 may be implemented employing two transistors, such as NMOS, PMOS transistors connected in a transmission gate arrangement, as illustrated in FIG. 13 of a fourth embodiment of a second DAC.

A data driver, an organic light emitting display, and a method of driving the same according to the exemplary embodiments of the present invention may include switches arranged between inputs for receiving two gray scale voltages supplied to the second DAC and the output terminal (out). The charging speed of the pixels may be significantly enhanced by supplying a gray scale voltage of the two gray scale voltages to the pixels via the switches. Also, the present invention may increase the voltage of the output terminal to the intermediate gray scale voltage by using, for example, a capacitor connected to the switches, thereby making it possible to enhance the precision of the gray scale. Also, the present invention may control the charge of the capacitor C and the voltage supplied to the second electrode of the capacitor C, thereby making it possible to control the level of the voltage supplied to the output terminal (out), and overcome any deviation of the manufacturing process, etc.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A data driver for driving a data line, the data driver comprising:
  a data signal generator having channels and being configured to generate a data signal, each channel of the data signal generator being provided with a first digital-to-analog converter and a second digital-to-analog converter; and
  a buffer unit that receives the data signal from the data signal generator, the buffer unit providing the data signal to the data line, wherein:
  the first digital-to-analog converter is configured to select first and second reference voltages from among a plurality of reference voltages depending on upper bits of data:
  the second digital-to-analog converter is configured to divide the first and second reference voltages into a plurality of voltages and supply tiny one voltage of the first and second reference voltages and the divided voltages to an output terminal as the data signal depending on lower bits of the data, the second digital-to-analog converter including a second switch and a capacitor,
  the second switch is coupled between one of the first reference voltage and a first electrode of the capacitor, the second switch receiving the first reference voltage and being configured to selectively couple the first reference voltage to the first electrode of the capacitor,
  the first electrode of the capacitor is coupled to the output terminal, and the output terminal is coupled to the buffer unit, such that the output terminal is between the first electrode and the buffer unit,
  a second electrode of the capacitor is coupled to a variation voltage, the variation voltage being received from a source external to the second digital-to-analog converter and varying a voltage of the capacitor that is applied to the output terminal,
  the second reference voltage has a voltage higher than the first reference voltage, the second digital-to-analog converter is configured to supply an intermediate gray scale voltage to the output terminal prior to supplying the data signal, the intermediate gray scale voltage being controlled by the variation voltage and having a voltage between the first and second reference voltages, and
  the second digital-to-analog converter is configured to supply the first reference voltage to the output terminal, without passing the first reference voltage through a voltage divider, the variation voltage that is supplied to the second electrode of the capacitor being varied so as to vary the first reference voltage at the output terminal.

2. The data driver as claimed in claim 1, wherein:
  the first digital-to-analog converter includes a tenth switch and an eleventh switch that are configured to be turned on to supply the first and second reference voltages, and
  the second switch is configured to receive the first reference voltage from the eleventh switch.

3. The data driver as claimed in claim 2, wherein the second digital-to-analog converter further includes:
  a plurality of voltage dividing resistors arranged between the tenth switch and the eleventh switch of the first digital-to-analog converter to divide the first and second reference voltages; and
  first switches arranged between nodes of the voltage dividing resistors and the output terminal and configured to be turned on depending on lower bits of the data, wherein:
  the second switch is arranged between the eleventh switch and the output terminal.

4. The data driver as claimed in claim 3, wherein the eleventh switch is connected to the first reference voltage and the tenth switch is connected to the second reference voltage.

5. The data driver as claimed in claim 4, wherein the second switch is arranged directly between the eleventh switch and the output terminal.

6. The data driver as claimed in claim 1, wherein the capacitor is configured to be charged to a voltage level substantially equal to the intermediate gray scale voltage.

7. The data driver as claimed in claim 3, wherein the second digital-to-analog converter further includes a compensation resistor arranged between the eleventh switch and the voltage dividing resistors to compensate for the resistance values of the tenth switch and the eleventh switch.

8. The data driver as claimed in claim 7, wherein the compensation resistor has a resistance value substantially equal to any one of the voltage dividing resistors.

9. The data driver as claimed in claim 1, wherein the data driver further includes:
  a shift register configured to supply sampling signals in sequence;
  a sampling latch unit configured to sample data in response to the sampling signals; and
  a holding latch unit configured to store data from the sampling latch unit, wherein:
  the data signal generator is configured to receive the data from the holding latch unit.

10. The data driver as claimed in claim 9, wherein the data driver further includes:
  a level shifter arranged between the holding latch unit and the data signal generator and configured to raise a voltage level of the data.

11. An organic light emitting display, comprising:
  a pixel unit including a plurality of pixels connected to scan lines and data lines;
  a scan driver configured to drive the scan lines; and
  a data driver configured to drive the data lines, the data driver including:
  a data signal generator having channels and being configured to generate a data signal, each channel of the data signal generator being provided with a first digital-to-analog converter and a second digital-to-analog converter; and
  a buffer unit that receives the data signal from the data signal generator, the buffer unit providing the data signal to the data line, wherein:
  the first digital-to-analog converter is configured to select first and second reference voltages from among a plurality of reference voltages depending on upper bits of data,
  the second digital-to-analog converter is configured to divide the first and second reference voltages into a plurality of voltages and supply any one voltage of the first and second reference voltages and the divided voltages to an output terminal as the data signal depending on lower bits of data, the second digital-to-analog converter including a second switch and a capacitor,
  the second switch is coupled between one-of the first reference voltage and a first electrode of the capacitor, the second switch receiving the one-of first reference voltage and being configured to selectively couple the first reference voltage to the first electrode of the capacitor, the first electrode of the capacitor is coupled to the output terminal, and the output terminal is coupled to the buffer unit, such that the output terminal is between the first electrode and the buffer unit, a second electrode of the capacitor is coupled to a variation voltage, the variation voltage being received from a source external to the second digital-to-analog converter and varying a voltage of the capacitor that is applied to the output terminal, the second reference voltage has a voltage higher than the first reference voltage, the second digital-to-analog converter is configured to supply an intermediate gray scale voltage to the output terminal prior to supplying the data signal, the intermediate gray scale voltage being controlled by the variation voltage and having a voltage between the first and second reference voltages, and the second digital-to-analog converter is configured to supply the first reference voltage to the output terminal, without passing the first reference voltage through a voltage divider, the variation voltage that is supplied to the second electrode of the capacitor being varied so as to vary the first reference voltage at the output terminal.

12. The organic light emitting display as claimed in claim 11, wherein the second digital-to-analog converter further includes:

voltage dividing resistors configured to divide the first and second reference voltages; and first switches configured to supply any one voltage of the voltage values divided by the voltage dividing resistors depending on lower bits of the data.

13. The organic light emitting display as claimed in claim 11, wherein the data driver further includes:

a shift register configured to supply sampling signals in sequence;

a sampling latch unit configured to sample data in response to the sampling signals; and a holding latch unit configured to store data from the sampling latch unit, wherein:

the data signal generator is configured to receive the data from the holding latch unit.

14. The organic light emitting display as claimed in claim 13, wherein the data driver further includes:

a level shifter arranged between the holding latch unit and the data signal generator and configured to raise a voltage level of the data.

15. A method of driving an organic light emitting display, comprising:

selecting two reference voltages of a plurality of reference voltages depending on upper bits of data in a first digital-to-analog converter;

dividing the two reference voltages into a plurality of voltages in a second digital-to-analog converter;

supplying an intermediate gray scale voltage between the two reference voltages to an output terminal during a first period of a horizontal period, the intermediate gray scale voltage being supplied to the output terminal via a node coupled to the output terminal;

controlling the voltage of the intermediate gray scale voltage by varying one of the two reference voltages using a variation voltage that is supplied from a source external to the second digital-to-analog converter and is applied to a second electrode of a capacitor, a first second electrode of the capacitor being coupled to the node;

supplying any one of the divided voltages and the two reference voltages to the output terminal as a data signal depending on lower bits of the data during a second period of the horizontal period;

supplying any one of the first and second reference voltages to the output terminal during an initial portion of the first period; and prior to supplying the any one of the divided voltages and the first and second reference voltages to the output terminal as the data signal, supplying the variation voltage to the second electrode of the capacitor, the supply of the variation voltage changing the voltage of the output terminal from the one of the first and second reference voltages to the intermediate gray scale voltage, wherein:

the two reference voltages include a first reference voltage and a second reference voltage, the second reference voltage being higher than the first reference voltage, and the variation voltage includes a first voltage during the first period and a second voltage during the second period, the first voltage being used to supply the first reference voltage to the output terminal and the second voltage being used to supply the intermediate gray scale voltage to the output terminal, the method further comprising:

supplying the first reference voltage to the output terminal, and controlling the voltage of the intermediate gray scale voltage by varying the first reference voltage, without passing the first reference voltage or the intermediate gray scale voltage through a voltage divider, and setting the second voltage to be higher than the first voltage during the second period so as to increase the voltage of the output terminal to the intermediate gray scale voltage.

* * * * *